United States Patent
Watanabe et al.

(10) Patent No.: US 8,963,276 B2
(45) Date of Patent: Feb. 24, 2015

(54) SEMICONDUCTOR DEVICE INCLUDING A CELL ARRAY HAVING FIRST CELLS AND SECOND CELLS INTERSPERSED AROUND THE ARRANGEMENT OF THE FIRST CELLS

(75) Inventors: Hiroshi Watanabe, Tokyo (JP); Naoki Yutani, Tokyo (JP); Yoshiyuki Nakaki, Tokyo (JP); Kenichi Ohtsuka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 70 days.

(21) Appl. No.: 13/883,073

(22) PCT Filed: Dec. 22, 2011

(86) PCT No.: PCT/JP2011/079828
§ 371 (c)(1),
(2), (4) Date: May 2, 2013

(87) PCT Pub. No.: WO2012/090861
PCT Pub. Date: Jul. 5, 2012

(65) Prior Publication Data
US 2013/0221477 A1 Aug. 29, 2013

(30) Foreign Application Priority Data
Dec. 28, 2010 (JP) ................................. 2010-292670

(51) Int. Cl.
*H01L 27/095* (2006.01)
*H01L 29/872* (2006.01)
(Continued)

(52) U.S. Cl.
CPC .......... *H01L 29/872* (2013.01); *H01L 29/6606* (2013.01); *H01L 27/0207* (2013.01); *H01L 29/0619* (2013.01); *H01L 29/0623* (2013.01); *H01L 29/1608* (2013.01)
USPC ........... 257/484; 257/155; 257/449; 257/471; 257/E21.359; 257/E29.338

(58) Field of Classification Search
CPC ............ H01L 29/1608; H01L 2924/00; H01L 2224/48247; H01L 29/872; H01L 29/0619
USPC .......... 257/155, 449, 471, 483, 484, E21.359, 257/E29.338
See application file for complete search history.

(56) References Cited

U.S. PATENT DOCUMENTS 5,101,244 A * 3/1992 Mori et al. .................... 257/471
5,535,231 A * 7/1996 Lee et al. .................. 372/50.21
(Continued)

FOREIGN PATENT DOCUMENTS

| JP | 3-248563 | 11/1991 |
| JP | 2000 294804 | 10/2000 |

(Continued)

OTHER PUBLICATIONS

Japanese Office Action issued Oct. 29, 2013, in Japan Patent Application No. 2012-550900 (with English translation).
(Continued)

*Primary Examiner* — Andy Huynh
(74) *Attorney, Agent, or Firm* — Oblon, Spivak, McClelland, Maier & Neustadt, L.L.P.

(57) ABSTRACT

A semiconductor device that can achieve a high-speed operation at a time of switching, and the like. The semiconductor device includes: a p-type buried layer buried within an $n^-$-type semiconductor layer; and a p-type surface layer formed in a central portion of each of cells. In a contact cell, the p-type buried layer is in contact with the p-type surface layer. The semiconductor device further includes: a $p^+$-type contact layer formed on the p-type surface layer of the contact cell; and an anode electrode provided on the $n^-$-type semiconductor layer. The anode electrode forms a Schottky junction with the $n^-$-type semiconductor layer and forms an ohmic junction with the $p^+$-type contact layer.

7 Claims, 12 Drawing Sheets

(51) Int. Cl.
*H01L 29/66* (2006.01)
*H01L 27/02* (2006.01)
*H01L 29/06* (2006.01)
*H01L 29/16* (2006.01)

(56) References Cited

U.S. PATENT DOCUMENTS

| | | | |
|---|---|---|---|
| 5,674,778 A * | 10/1997 | Lee et al. | 438/24 |
| 6,373,076 B1 * | 4/2002 | Alok et al. | 257/76 |
| 2003/0057482 A1 * | 3/2003 | Harada | 257/329 |
| 2007/0045764 A1 | 3/2007 | Hatakeyama et al. | |
| 2011/0215338 A1 * | 9/2011 | Zhang | 257/73 |

FOREIGN PATENT DOCUMENTS

| | | |
|---|---|---|
| JP | 2002 76370 | 3/2002 |
| JP | 2004-6723 | 1/2004 |
| JP | 2005 229070 | 8/2005 |
| JP | 2007 59698 | 3/2007 |
| JP | 2008 130855 | 6/2008 |
| JP | 2009 260057 | 11/2009 |
| JP | 2010 40857 | 2/2010 |

OTHER PUBLICATIONS

International Preliminary Report on Patentability issued Jul. 11, 2013 in PCT/JP2011/079828 filed Dec. 22, 2011.
English translation of the International Preliminary Report on Patentability issued Jul. 18, 2013 in PCT/JP2011/079828 filed Dec. 22, 2011.
Written Opinion of the International Searching Authority issued Feb. 28, 2012 in PCT/JP2011/079828 filed Dec. 22, 2011 (with English language translation).
International Search Report Issued Feb. 28, 2012 in PCT/JP11/79828 Filed Dec. 22, 2011.

* cited by examiner

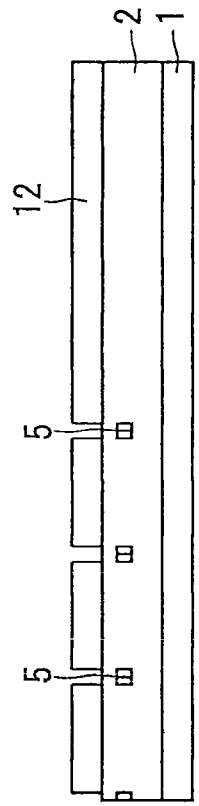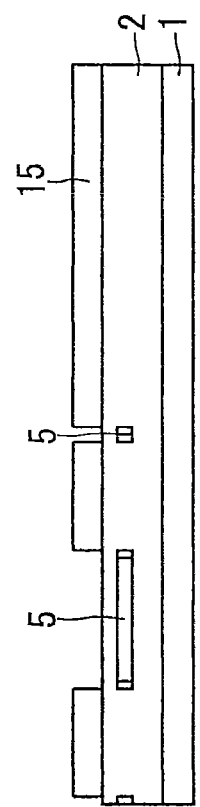

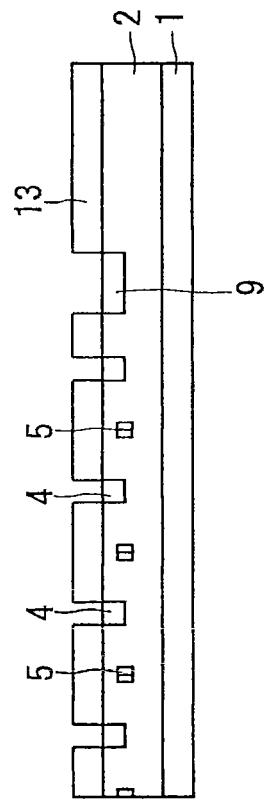
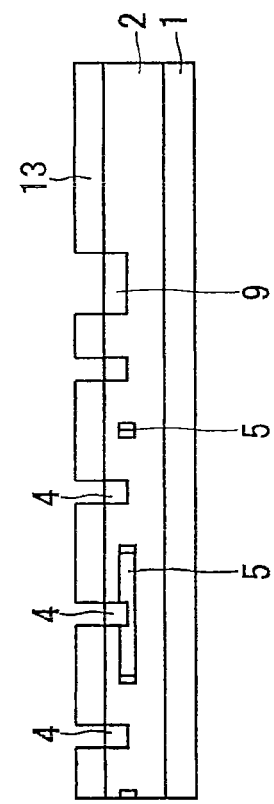

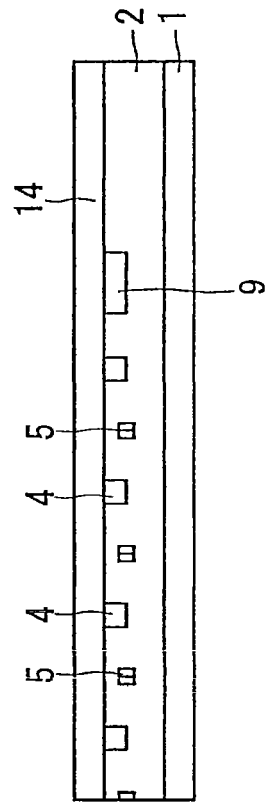
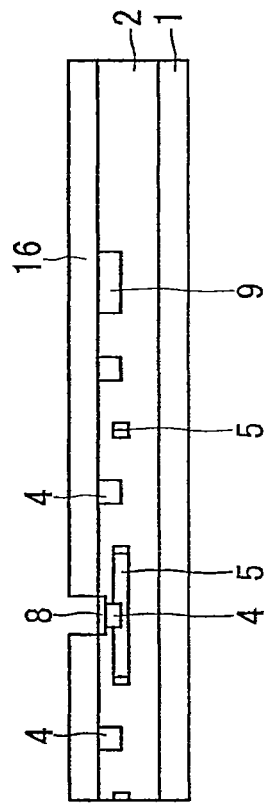

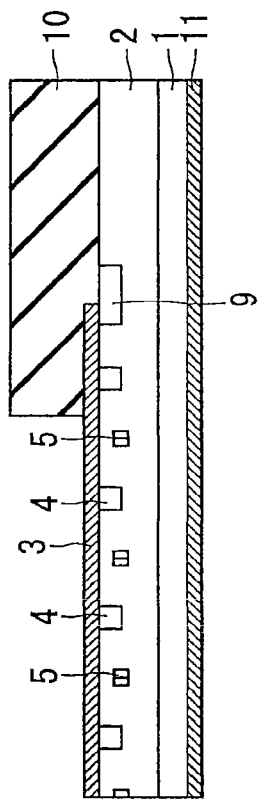
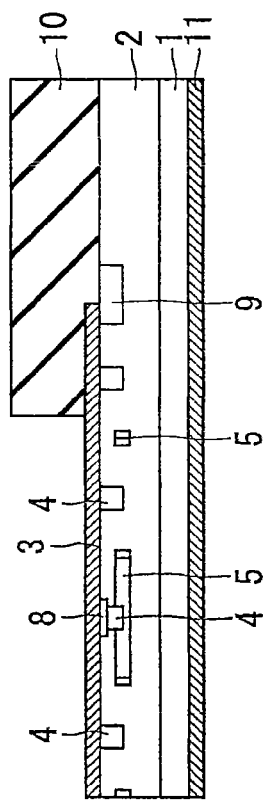

SEMICONDUCTOR DEVICE INCLUDING A CELL ARRAY HAVING FIRST CELLS AND SECOND CELLS INTERSPERSED AROUND THE ARRANGEMENT OF THE FIRST CELLS

TECHNICAL FIELD

The present invention relates to a semiconductor device, and particularly to a Schottky barrier diode.

BACKGROUND ART

A Schottky barrier diode (SBD; Schottky Barrier Diode) that is a semiconductor device is a unipolar device, and therefore capable of high-speed switching, and also capable of high-speed operation with a small loss because a device having a low on-voltage is achieved by using a metal whose barrier height relative to a semiconductor interface is low.

In recent years, by making use of the above-mentioned features, a SBD made of silicon carbide (SiC) is expected as a semiconductor device having a high breakdown voltage and capable of high-speed switching with a small loss However, an attempt to reduce the barrier height by, for example, reducing the thickness of an epitaxial film or increasing an epi-concentration for the purpose of further lowering the on-voltage undesirably increases a leakage current caused when a reverse voltage is applied. To solve this problem, a SBD has been proposed in which a pn junction is used to reduce a leakage current.

One of such SBDs is disclosed in Patent Document 1, in which, for the purpose of preventing an increase in the on-voltage, a p-type buried layer is provided inside an $n^-$-type semiconductor layer and a half of a pn junction formed on a surface is buried within the $n^-$-type semiconductor layer, in order to enlarge the area of a Schottky junction.

Patent Document 2 discloses a SBD in which a surface of a semiconductor layer that has been epitaxially formed has no pn junction portion formed therein and a p-type buried layer is buried in a stripe-like or mesh-like pattern in a plan view such that a part of the p-type buried layer is in ohmic contact with an anode electrode via a connection conductor.

In Patent Documents 1 and 2 mentioned above, the pn junction is mixed in the SBD, to thereby reduce the leakage current and also suppress an increase in the on-voltage which is caused by reduction in the area of the Schottky junction.

PRIOR-ART DOCUMENTS

Patent Documents

Patent Document 1: Japanese Patent Application Laid-Open No. 2000-294804
Patent Document 2: Japanese Patent Application Laid-Open No. 2010-40857

SUMMARY OF THE INVENTION

Problems to be Solved by the Invention

In the SBD disclosed in Patent Document 1, a region interposed between the p-type surface layer and the p-type buried layer has a very narrow width. This causes a problem that the on-resistance increases.

Additionally, since the p-type buried layer is in connect with the anode electrode via a p-type contact layer, a resistance to a part of the p-type buried layer located in a central portion of the SBD, which is distant from a terminal portion, increases. This causes a problem that a high-speed operation at a time of switching is suppressed.

In the SBD disclosed in Patent Document 2, a part of the p-type buried layer is in ohmic contact with the anode electrode via the connection conductor. Here, as the width of the p-type buried layer decreases, the width of the connection conductor also decreases. Accordingly, a contact resistance between the connection conductor and the p-type buried layer increases. As a result, a problem is caused that a high-speed operation at a time of switching is suppressed.

The present invention has been made to solve the above-described problems, and an object of the present invention is to provide a semiconductor device that can reduce a leakage current and an on-resistance, and can achieve a high-speed operation at a time of switching.

Means for Solving the Problems

The present invention is a semiconductor device including a cell array in which first cells are arranged and second cells are interspersed around the arrangement of the first cells. The semiconductor device includes: a semiconductor layer having a first conductive type, the semiconductor layer being epitaxially formed on a semiconductor substrate having the first conductive type; a buried layer made of a semiconductor having a second conductive type, the buried layer being buried within the semiconductor layer, the buried layer being provided in a peripheral portion of the first cell and provided throughout an entire region of the second cell; at least one of a first surface layer made of a semiconductor having the second conductive type and a contact layer made of a semiconductor having the second conductive type, the first surface layer being formed in a central portion of the second cell on a surface of the semiconductor layer, the contact layer being formed in a central portion of the second cell on the surface of the semiconductor layer; and a second surface layer made of a semiconductor having a second conductive type, the second surface layer being formed in a central portion of the first cell on the surface of the semiconductor layer. In the second cell, the buried layer is in contact with at least one of the first surface layer and the contact layer. The semiconductor device further includes an anode electrode that forms a Schottky junction with the semiconductor layer and forms an ohmic junction with at least one of the first surface layer and the contact layer. The buried layer and the anode electrode are connected to each other via at least one of the first surface layer and the contact layer.

Effects of the Invention

The present invention provides a semiconductor device including a cell array in which first cells are arranged and second cells are interspersed around the arrangement of the first cells. The semiconductor device includes: a semiconductor layer having a first conductive type, the semiconductor layer being epitaxially formed on a semiconductor substrate having the first conductive type; a buried layer made of a semiconductor having a second conductive type, the buried layer being buried within the semiconductor layer, the buried layer being provided in a peripheral portion of the first cell and provided throughout an entire region of the second cell; at least one of a first surface layer made of a semiconductor having the second conductive type and a contact layer made of a semiconductor having the second conductive type, the first surface layer being formed in a central portion of the second cell on a surface of the semiconductor layer, the contact layer being formed in a central portion of the second cell on the surface of the semiconductor layer; and a second surface layer made of a semiconductor having a second conductive type, the second surface layer being formed in a central portion of the first cell on the surface of the semiconductor layer. In the second cell, the buried layer is in contact with at least one of the first surface layer and the contact layer. The semiconductor device further includes an anode electrode that forms a Schottky junction with the semiconductor layer and forms an ohmic junction with at least one of the first surface layer and the contact layer. The buried layer and the anode electrode are connected to each other via at least one of the first surface layer and the contact layer. This can achieve reduction in a leakage current due to reduction in the strength of an electric field, reduction in an on-resistance due to enlargement of a current path, and a high-speed operation at a time of switching due to shortening of a time taken until a depletion layer disappears.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 7A and 7B are cross-sectional views showing the semiconductor device during the manufacturing process according to the embodiment 1 of the present invention.

FIGS. 8A and 8B are cross-sectional views showing the semiconductor device during the manufacturing process according to the embodiment 1 of the present invention.

FIGS. 9A and 9B are cross-sectional views showing the semiconductor device during the manufacturing process according to the embodiment 1 of the present invention.

FIGS. 11A and 11B are cross-sectional views showing the semiconductor device during the manufacturing process according to the embodiment 1 of the present invention.

EMBODIMENTS FOR CARRYING OUT THE INVENTION

A. Embodiment 1

A semiconductor device (SBD) as an underlying technology of the present invention will be described with reference to FIG. 15.

Figure 15:
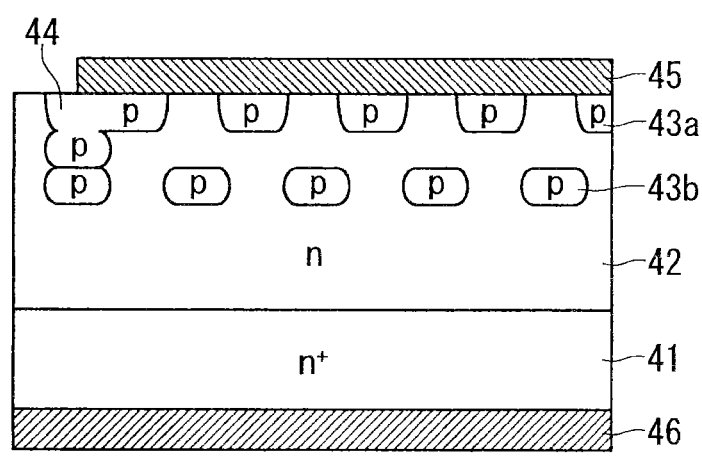
FIG. 15 is a cross-sectional view showing a semiconductor device according to an underlying technology.

In a semiconductor device shown in FIG. 15, an $n^-$-type semiconductor layer 42 is epitaxially formed on an $n^+$-type semiconductor substrate 41, and a p-type surface layer 43a is formed in a surface of the $n^-$-type semiconductor layer 42, and a p-type buried layer 43b is buried within the $n^-$-type semiconductor layer 42.

A anode electrode 45 that forms a Schottky junction is provided on a surface of the $n^-$-type semiconductor layer 42. The anode electrode 45 is also in contact with a $p^+$-type contact layer 44 that is formed in the surface of the $n^-$-type semiconductor layer 42. Since the $p^+$-type contact layer 44 is also in connect with the p-type buried layer 43b, the p-type buried layer 43b is, via the $p^+$-type contact layer 44, kept at the same potential as that of the anode electrode 45.

A cathode electrode 46 that forms an ohmic junction is provided on a lower surface of the $n^+$-type semiconductor substrate 41.

In such a structure, in a case where the p-type surface layer 43a that forms a pn junction is arranged at a high density in the surface of the $n^-$-type semiconductor layer 42, the area where the Schottky junction is formed is reduced by the area where the pn junction is formed. As a result, an on-voltage increases.

To prevent this, the p-type buried layer 43b is provided inside the $n^-$-type semiconductor layer 42, so that the half of the pn junction formed in the surface is buried within the $n^-$-type semiconductor layer 42, thereby attempting to enlarge the area of the Schottky junction.

In this SBD, the p-type surface layer 43a and the p-type buried layer 43b are displaced from each other in a plan view, and a region interposed between the p-type surface layer 43a and the p-type buried layer 43b has a very narrow width of 0.2 μm to 2 μm. Therefore, there is a narrow current path inside the $n^-$-type semiconductor layer 42. This causes a problem that the on-resistance increases.

Additionally, the p-type buried layer 43b is in connect with the anode electrode 45 via the $p^+$-type contact layer 44 that is formed in a terminal portion of the anode electrode 45. As a result, a resistance to the p-type buried layer 43b located in a central portion of the SBD, which is distant from the terminal portion, increases. This causes a problem that a high-speed operation at a time of switching is suppressed. Moreover, there is a fear that the in-plane uniformity of device characteristics may deteriorate.

An embodiment described below illustrates a semiconductor device that can solve the above-mentioned problems.

A-1. Configuration

Here, as a semiconductor device according to the present invention, a Schottky barrier diode (SBD) will be described.

Figure 1:
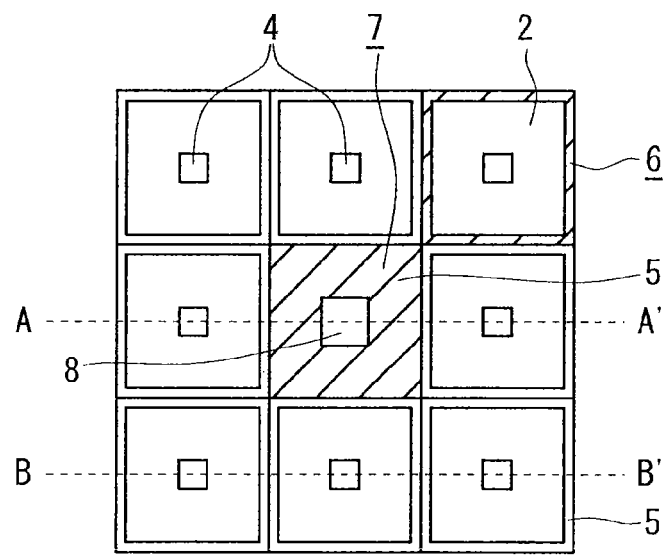
FIG. 1 is a top view of a semiconductor device according to the present invention.
Figure 2:
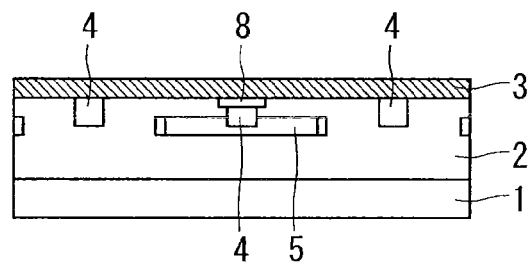
FIG. 2 is a cross-sectional view showing a part of a semiconductor device according to an embodiment 1 of the present invention.
Figure 3:
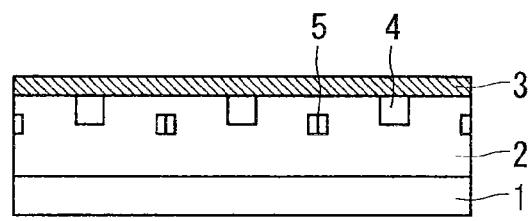
FIG. 3 is a cross-sectional view showing a part of the semiconductor device according to the embodiment 1 of the present invention.
Figure 4:
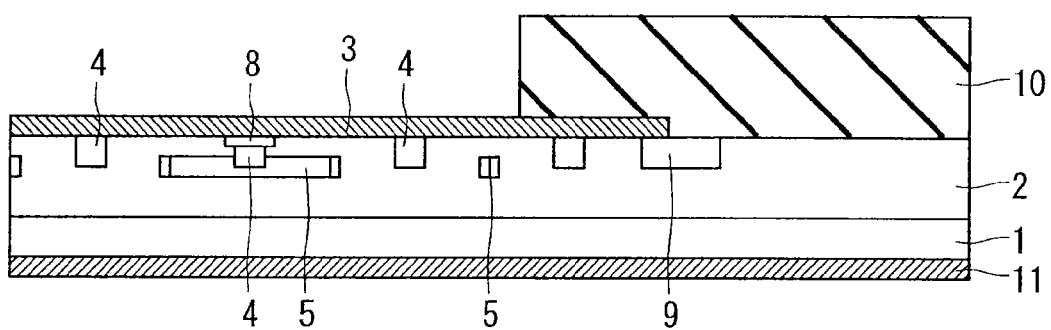
FIG. 4 is a cross-sectional view showing a part of the semiconductor device according to the embodiment 1 of the present invention.
Figure 5:
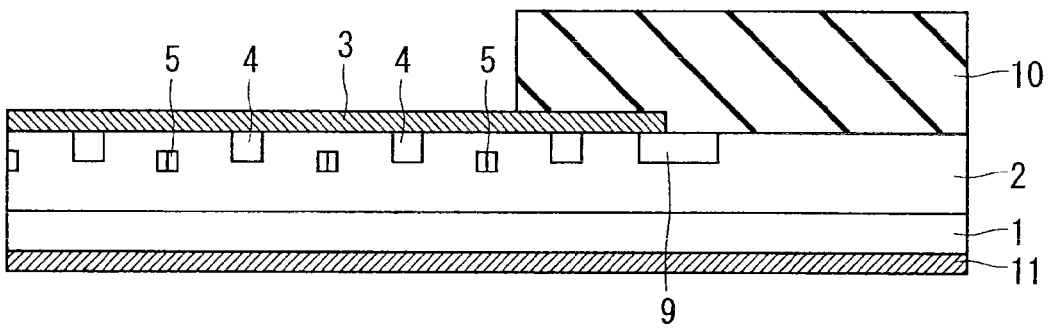
FIG. 5 is a cross-sectional view showing a part of the semiconductor device according to the embodiment 1 of the present invention.

FIG. 1 is a top view (perspective view) of a semiconductor device according to an embodiment 1 of the present invention. FIG. 2 is a cross-sectional view as taken along the line A-A' of FIG. 1, and FIG. 3 is a cross-sectional view as taken along the line B-B' of FIG. 1. FIG. 4 is a cross-sectional view showing a part of a SBD including a peripheral end portion and an A-A' portion. FIG. 5 is a cross-sectional view showing a part of the SBD including a peripheral end portion and a B-B' portion.

As shown in FIG. 1, in the semiconductor device (SBD) according to the present invention, a p-type surface layer 4 is formed in a surface of an n⁻-type semiconductor layer 2, and a p-type buried layer 5 is buried within the n⁻-type semiconductor layer 2 such that the p-type buried layer 5 having, for example, a ring-like shape surrounds the p-type surface layer 4 in a plan view. A plurality of normal cells 6 (first cells), each of which is a unit cell surrounded by the p-type buried layer 5 in a plan view, are arranged in an array. In a plan view, the p-type surface layer 4 is formed at the center of the cell.

Adjacent normal cells 6 are arranged at an interval corresponding to a cell pitch. The p-type buried layers 5 of the adjacent normal cells 6 are in contact with each other within the n⁻-type semiconductor layer 2.

Furthermore, contact cells 7 (second cell) different from the normal cells 6 are interspersed. The contact cell 7 is formed between the normal cells 6 arranged in an array. In a plan view, the p-type surface layer 4 is formed at the center of the cell.

In the contact cell 7, a p⁺-type contact layer 8 serving as a contact layer is additionally formed on the p-type surface layer 4 that is provided in the surface of the n⁻-type semiconductor layer 2 (in FIG. 1, the p-type surface layer 4 of the contact cell 7 is not shown). Moreover, unlike in the normal cell 6, the p-type buried layer 5 extends to a position immediately below the p-type surface layer 4 and thus is formed throughout the contact cell 7 within n⁻-type semiconductor layer 2. The contact cells 7 are spaced apart from one another and interspersed around. Within the n⁻-type semiconductor layer 2, the contact cell 7 is in contact with the p-type buried layers 5 of the normal cells 6 adjacent to this contact cell 7.

The p-type buried layer 5 of the contact cell 7 is connected to an anode electrode 3 via the p-type surface layer 4 and the p⁺-type contact layer 8. Thus, the p-type buried layer 5 has a potential close to the potential of the anode electrode 3. The p-type buried layer 5 of the normal cell 6, which is connected to the p-type buried layer 5 of the contact cell 7, also has a potential close to the potential of the anode electrode 3.

Accordingly, at a time of switching from a state where a reverse voltage is applied to a state where a forward voltage is applied, a depletion layer in a pn junction of the p-type buried layer 5, which has been expanded under the state where the reverse voltage is applied, can be disappeared in a shortened time. That is, a high-speed switching operation is achieved.

The ratio of the number of the arranged contact cells 7 relative to the number of the arranged normal cells 6 is about 1 to 25. That is, the contact cells 7 occupy about 4% of the entire cell area. In the normal cell 6, the p-type buried layer 5 and the anode electrode 3 are not electrically connected. Therefore, a current path on the surface of the n⁻-type semiconductor layer 2 in a region immediately above the p-type buried layer 5 is not limited, and an increase in the on-voltage can be suppressed.

The p-type buried layer 5 of the normal cell 6 is not directly connected to the anode electrode 3, but connected to the anode electrode 3 via the p⁺-type contact layer 8 of the contact cell 7. Such a configuration can avoid the need to provide a connection layer that connects the anode electrode 3 and the p-type buried layer 5 to each other within the normal cell 6. In order to achieve connection to the anode electrode 3 within the normal cell 6, it is necessary to provide a contact having a small contact area within the width occupied by the p-type buried layer 5, and moreover alignment with high accuracy is also required.

Providing connection to the anode electrode 3 via the contact cell 7 as shown in this embodiment 1 enables contact to be provided within the cell area of the contact cell 7 by means of the electric field shield effect of the p-type buried layer 5 of the contact cell 7. Thus, the contact resistance can be reduced, and alignment with high accuracy is not required.

In the normal cell 6, the p-type buried layer 5 is formed with a ring-like shape, for example. Accordingly, the depletion layer that is two-dimensionally expanded upon application of the reverse voltage can two-dimensionally shield the strength of an electric field acting on the anode electrode 3. This can more effectively reduce the strength of the electric field as compared with, for example, a p-type buried layer formed in a pattern of equally-spaced stripes. As a result, the width occupied by the p-type buried layer 5 can be reduced, and thus the current path can be enlarged.

Additionally, while the cell is a square of 10 μm side, the p-type surface layer 4 that is in contact with the anode electrode 3 on the surface of the n⁻-type semiconductor layer 2 is a square of 2 μm side. Thus, the area of the p-type surface layer 4 per cell, which is in contact with the anode electrode 3, is only about 4% of the cell area. Therefore, the current path located immediately above the p-type buried layer 5 is not limited, and an increase in the on-voltage can be suppressed.

Moreover, since the p-type surface layer 4 is arranged at the center of the cell, the strength of the electric field can be reduced in a central portion of the cell where the electric field is most likely to concentrate because of the ring-like arrangement of the p-type buried layer 5. Accordingly, there is no need to increase the width occupied by the p-type buried layer 5 in order to reduce the strength of the electric field. Thus, the strength of the electric field can be reduced to achieve reduction in a leakage current, with suppression of the width occupied by the p-type buried layer 5. Suppression of the width occupied by the p-type buried layer 5 can lower the on-voltage at a time when the forward voltage is applied.

Here, since the formation of contact is allowed as long as it is within the cell area of the contact cell 7, it is possible that the longitudinal and lateral sizes of the p⁺-type contact layer 8 are larger than those of the p-type surface layer 4.

Generally, in a high-concentration implanted layer such as the p⁺-type contact layer 8, expansion of a depletion layer is not likely to occur. Accordingly, there is a possibility that an electric field may concentrate on the boundary of the implanted layer to cause a decrease in the breakdown voltage. Therefore, it is necessary that a low-concentration layer such as the p-type surface layer 4 is formed around the p⁺-type contact layer 8.

In this embodiment 1, below the p⁺-type contact layer 8 (within the n⁻-type semiconductor layer 2), the p-type buried layer 5 is arranged over the entire cell area of the contact cell 7. Accordingly, even when the p⁺-type contact layer 8 is formed with a large size beyond the region of the p-type surface layer 4, concentration of the electric field on such a portion beyond the region corresponding to the p-type surface layer 4 is reduced due to the electric field shield effect of the p-type buried layer 5. As a result, no decrease in the breakdown voltage occurs. Even in a case where the p-type buried layer 5 is not formed over the entire region of the contact cell 7, the electric field shield effect can be obtained in accordance with the area occupied by the p-type buried layer 5. Therefore, within such a range, the size of the p$^+$-type contact layer 8 can be adjusted.

The shape of the p-type buried layer 5 surrounding the p-type surface layer 4 is not limited to the one shown in FIG. 1. Various shapes including circular shapes, polygonal shapes, and the like, are adoptable.

FIG. 2 is a cross-sectional view as taken along the line A-A' of FIG. 1. As shown in FIG. 2, the n$^-$-type semiconductor layer 2 is epitaxially formed on an n$^+$-type semiconductor substrate 1 made of, for example, silicon carbide (SiC), and the p-type surface layers 4 spaced apart from one another are formed in a main surface of the n$^-$-type semiconductor layer 2. The p-type buried layer 5 is buried within the n$^-$-type semiconductor layer 2 such that the p-type buried layer 5 having, for example, a ring-like shape surrounds the p-type surface layer 4 in a plan view. That is, this structure corresponds to the structure of the normal cell 6 described above. Below the p-type surface layer 4 having the p$^+$-type contact layer 8 formed thereon among the p-type surface layer 4s, the p-type buried layer 5 extends in contact with a lower surface of the p-type surface layer 4. That is, this structure corresponds to the structure of the contact cell 7 described above.

The reduction in the strength of the electric field of the anode electrode 3 upon application of the reverse voltage is achieved mainly by the electric field shield effect of the p-type buried layer 5. Therefore, the strength of the electric field is reduced and the leakage current is reduced, with little decrease in the contact area between the n$^-$-type semiconductor layer 2 and the anode electrode 3.

Additionally, the anode electrode 3 is provided which is formed on the n$^-$-type semiconductor layer 2 and functions as a Schottky junction. The p-type surface layer 4 and the p$^+$-type contact layer 8 formed on the n$^-$-type semiconductor layer 2 are also in contact with the anode electrode 3.

FIG. 3 is a cross-sectional view as taken along the line B-B' of FIG. 1. As shown in FIG. 3, the n$^-$-type semiconductor layer 2 is epitaxially formed on the n$^+$-type semiconductor substrate 1 made of, for example, silicon carbide (SiC), and the p-type surface layers 4 spaced apart from one another are formed in the main surface of the n$^-$-type semiconductor layer 2. The p-type buried layer 5 is buried within the n$^-$-type semiconductor layer 2 such that the p-type buried layer 5 surrounds the p-type surface layer 4 in a plan view. That is, this structure corresponds to the structure of the normal cell 6 described above.

Additionally, the anode electrode 3 is provided which is formed on the n$^-$-type semiconductor layer 2 and functions as a Schottky junction.

FIGS. 4 and 5 are cross-sectional views of end portions of the SBD in which the contact cells 7 and the normal cells 6 are arranged in a two-dimensional array. A guard ring layer 9 made of a p-type semiconductor is formed in the surface of the n$^-$-type semiconductor layer 2 below an end portion of the anode electrode 3 that extends to the end portion of the SBD. The guard ring layer 9 is for expanding the depletion layer and keeping the breakdown voltage. Moreover, an insulating film 10 is formed so as to cover the guard ring layer 9 and a region around and over the end portion of the anode electrode 3.

Additionally, a cathode electrode 11 that functions as an ohmic contact is provided on a lower surface of the n$^+$-type semiconductor substrate 1.

In a pn junction portion, when the operation of a pn diode is turned ON, a current from the anode electrode 3 flows toward the cathode electrode 11 of the n$^-$-type semiconductor layer 2 via the p-type buried layer 5 of the contact cell 7. In a case where a high current flows in the forward direction due to a surge current or the like, the current flowing from the p-type buried layer 5 having the pn junction becomes more dominant than the current flowing from the anode electrode 3 having the Schottky junction.

At this time, due to the high current, heat is generated in the p-type buried layer 5. In a case where the p-type buried layer 5 is immediately below the anode electrode 3, breakdown of the anode electrode 3 is likely to occur because of the heat generation. However, in this embodiment 1, the p-type buried layer 5 is formed within the n$^-$-type semiconductor layer 2 and not in direct contact with the anode electrode 3. This enables the current to flow under a lower the contact resistance. Thus, breakdown of the device because of heat generation can be prevented.

A-2. Manufacturing Method

Figure 12:
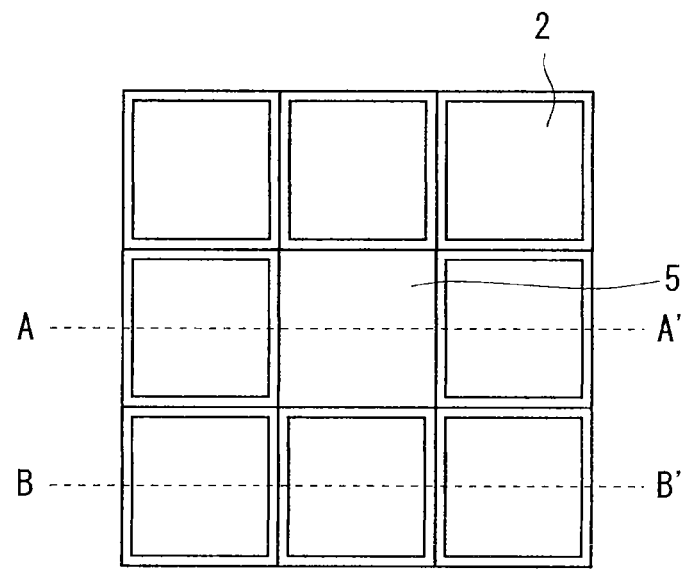
FIG. 12 is a top view showing the semiconductor device during the manufacturing process according to the embodiment 1 of the present invention.
Figure 13:
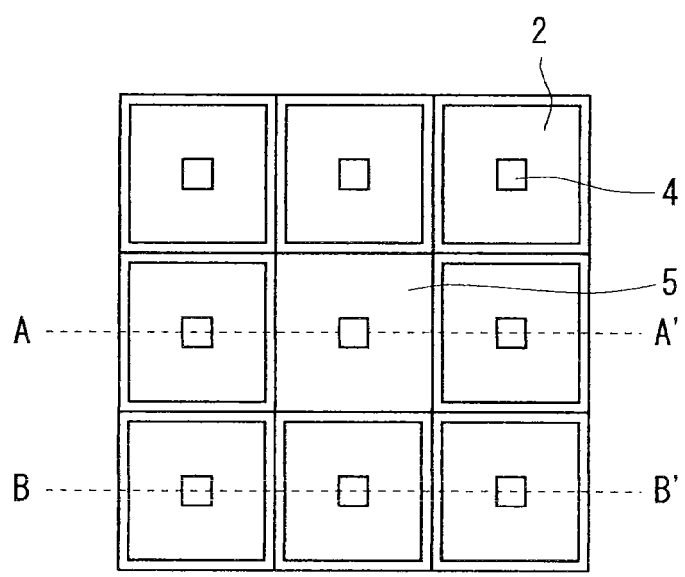
FIG. 13 is a top view showing the semiconductor device during the manufacturing process according to the embodiment 1 of the present invention.
Figure 14:
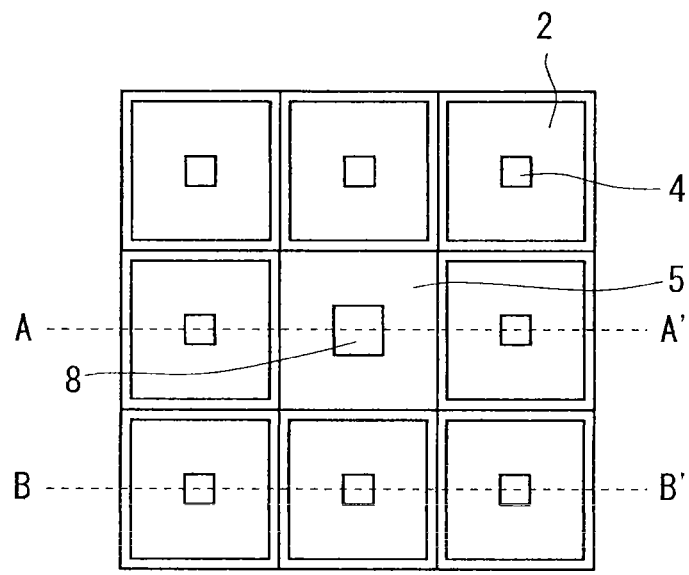
FIG. 14 is a top view showing the semiconductor device during the manufacturing process according to the embodiment 1 of the present invention.

Next, a method for manufacturing the semiconductor device (SBD) according to the present invention will be described below with reference to cross-sectional views showing the semiconductor device during a manufacturing process. FIG. 6A, FIG. 7A, FIG. 8A, FIG. 9A, FIG. 10A and FIG. 11A are cross-sectional views showing a part of the SBD including a peripheral end portion and an A-A' portion in which the contact cell 7 is formed. FIG. 6B, FIG. 7B, FIG. 8B, FIG. 9B, FIG. 10B and FIG. 11B are cross-sectional views showing a part of the SBD including a peripheral end portion and a B-B' portion in which the normal cell 6 is formed. FIGS. 12 to 14 are top views showing a part of the SBD including the A-A' portion and the B-B' portion.

Herein, a method for manufacturing a SBD in which a substrate made of 4H-SiC (silicon carbide) is used as the n$^+$-type semiconductor substrate will be described as an example.

Figure 6A:
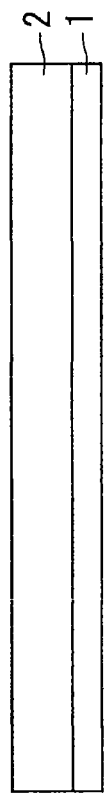
FIGS. 6A and 6B are cross-sectional views showing the semiconductor device during a manufacturing process according to the embodiment 1 of the present invention.
Figure 6B:
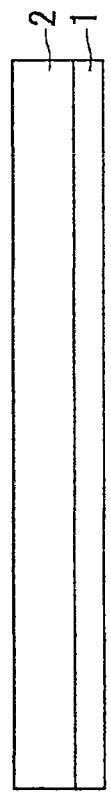

Firstly, in a first step, as shown in FIG. 6A and FIG. 6B, a substrate having the n$^-$-type semiconductor layer 2 formed on the n$^+$-type semiconductor substrate 1 is prepared. The n$^+$-type semiconductor substrate 1 is, for example, a 4H-SiC (silicon carbide) substrate having a resistivity of 0.02 Ω·cm. As the n$^-$-type semiconductor layer 2, for example, the one having a thickness of 10 µm and containing n-type impurities with an impurity concentration of $5 \times 10^{15}$ cm$^{-3}$ is adopted. The impurity concentration and the thickness of the n$^-$-type semiconductor layer vary depending on the breakdown voltage designed for a semiconductor device.

In a second step, as shown in FIG. 7A, FIG. 7B and in FIG. 12, ion implantation is performed in the normal cell 6 and the contact cell 7 by using masks 12 and 15.

In the normal cell 6 (see FIG. 7B, and the line B-B' of FIG. 12), a pattern of the mask 12 is formed on the surface of the n$^-$-type semiconductor layer 2, and an opening having a ring-like shape is formed in an outer peripheral portion at the boundary of the cell. Then, p-type impurities are ion-implanted, to form the p-type buried layer 5 in a region within each cell near the outer periphery thereof. The openings of adjacent cells are formed as one opening region.

Herein, the cell is formed with a rectangular shape of 10 μm on the longitudinal side and 10 μm on the lateral side. The cells are arranged at pitches of 10 μm in the longitudinal and lateral directions.

A resist or an oxide film is adoptable as the mask 12. The width S of the mask opening, which extends from the outer peripheral boundary to the inside of the cell is 1 μm. However, the openings of the adjacent cells are connected. Therefore, the width of the opening between the adjacent cells is 2 μm.

On the other hand, in the contact cell 7 (see FIG. 7A and the line A-A' of FIG. 12), an opening is formed throughout the entire region of the contact cell 7, to form the p-type buried layer 5 that continuously extends from the outer peripheral portion at the boundary of the cell to the central portion of the cell. At the boundary of the cell, the opening is connected to the opening of the adjacent normal cell 6. Thus, the openings are continuously connected to each other. As the mask 15, a resist or an oxide film is adoptable.

In the ion implantation, for example, aluminum serving as p-type impurities is implanted with an irradiation intensity of $3\times10^{13}$ cm$^{-2}$ and an acceleration voltage of 700 keV. An implantation profile has a convex concentration distribution in which, for example, a peak implantation concentration occurs with a concentration of $1\times10^{18}$ cm$^{-3}$ and at a depth of 0.7 μm from the surface in the depth direction, and the concentration decreases toward the surface side and the back surface side. The p-type impurity concentration in the vicinity of the surface of the n$^-$-type semiconductor layer 2 is lower than the n-type impurity concentration of the n$^-$-type semiconductor layer 2. When an implantation region having an impurity concentration equal to or higher than the half of the peak impurity concentration is defined as the thickness of the implantation region, the thickness of the p-type buried layer 5 is about 0.2 μm.

In a third step, as shown in the FIG. 8A, FIG. 8B and in FIG. 13, the masks 15 and 12 are removed, and then a pattern of a new mask 13 is formed on the n$^-$-type semiconductor layer 2. After a mask opening is formed in a central portion of the cell, p-type impurities are ion-implanted, to form the p-type surface layer 4 in a superficial layer portion of the n$^-$-type semiconductor layer 2.

In the ion implantation, for example, aluminum serving as p-type impurities is implanted with an irradiation intensity of $3\times10^{13}$ cm$^{-2}$ while the acceleration voltage is varied in multiple levels from 40 to 500 keV. The mask opening which corresponds to the width of the p-type surface layer 4 has a square shape of 2 μm on the longitudinal side and 2 μm on the lateral side. The p-type surface layer 4 constitutes an implanted layer having a box-shaped profile in which the depth from the surface is 0.6 μm and the concentration is $2\times10^{17}$ cm$^{-3}$.

In the normal cell 6, the p-type surface layer 4 and the p-type buried layer 5 do not overlap each other (see FIG. 8B, and the line B-B' of FIG. 13), but in the contact cell 7, the p-type buried layer 5 and the p-type surface layer 4 formed in the central portion of the cell overlap each other and are in contact with each other within the n$^-$-type semiconductor layer 2 (see FIG. 8A, and the line A-A' of FIG. 13).

In this ion implantation, additionally, the guard ring layer 9 is simultaneously formed for the purpose of relieving the concentration of the electric field on the end of the anode electrode 3. The guard ring layer 9 is formed by ion-implanting the p-type impurities so as to surround the end of the anode electrode 3 which will be formed in the subsequent step.

In a fourth step, as shown in the FIG. 9A, FIG. 9B and in FIG. 14, the mask 13 is removed, and then new masks 16 and 14 are formed. At this stage, in the mask 16, a pattern is formed only in a portion corresponding to the contact cell 7, to form a mask opening in a portion corresponding to the central portion of the contact cell 7. Then, p-type impurities are ion-implanted, to form the p$^+$-type contact layer 8 (see FIG. 9B, and the line B-B' of FIG. 14).

In the ion implantation, for example, aluminum serving as p-type impurities is implanted with an acceleration voltage of 40 keV and 100 keV and an irradiation intensity of $3\times10^{15}$ cm$^{-2}$. The p$^+$-type contact layer 8 has a square shape of 3 μm on the longitudinal side and 3 μm on the lateral side. The p$^+$-type contact layer 8 constitutes an implanted layer having a box-shaped profile in which the depth from the surface is 0.2 μm and the concentration is $1\times10^{20}$ cm$^{-3}$. In the contact cell 7, the p$^+$-type contact layer 8 and the p-type surface layer 4 overlap each other and are in contact with each other.

In a fifth step, the masks 16 and 14 are removed, and then activation annealing is performed in order to activate the impurities implanted in the p-type surface layer 4, the p-type buried layer 5, the p$^+$-type contact layer 8, and the guard ring layer 9. The activation annealing is performed, for example, at 1700° C. for 10 minutes.

Figure 10A:
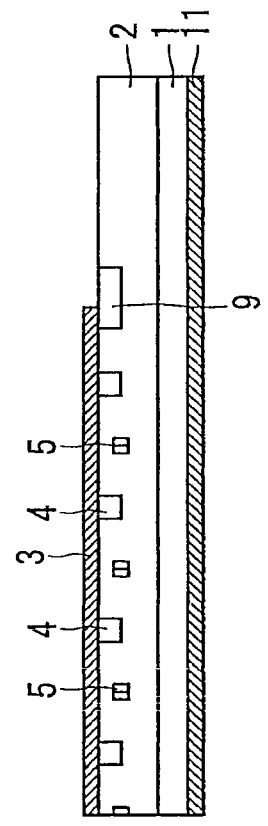
FIGS. 10A and 10B are cross-sectional views showing the semiconductor device during the manufacturing process according to the embodiment 1 of the present invention.
Figure 10B:
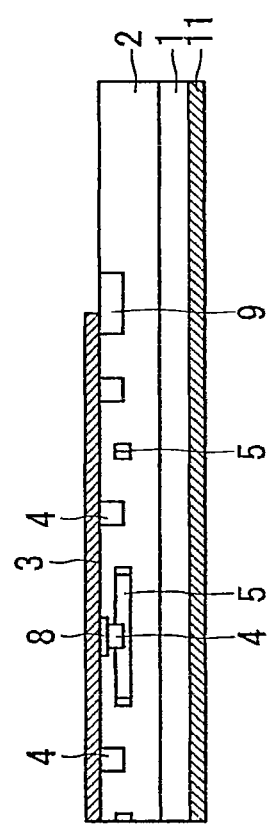

In a sixth step, as shown in FIG. 10A and FIG. 10B, a film of the cathode electrode 11 made of nickel is formed on the back surface of the n$^+$-type semiconductor substrate 1, and annealing is performed at 1000° C. Thereby, an ohmic electrode is formed.

Then, a film of the anode electrode 3 made of titanium or nickel is formed on the surface of the n$^-$-type semiconductor layer 2, the surface of the p-type surface layer 4, the surface of the p$^+$-type contact layer 8, and a part of the surface of the guard ring layer 9. Then, annealing is performed at 500° C. An outer peripheral end portion of the anode electrode 3 is in contact with the guard ring layer 9.

The n$^-$-type semiconductor layer 2, the p-type surface layer 4, and the guard ring layer 9 form a Schottky junction with the anode electrode 3. The p$^+$-type contact layer 8 forms an ohmic junction with the anode electrode 3. Although it is desirable that the p$^+$-type contact layer 8 and the anode electrode 3 form an ohmic junction, an imperfect ohmic junction is allowable as long as the contact resistance is reduced to about $1\times10^{-2}$ Ωcm$^2$. In order to sufficiently reduce the contact resistance, it is necessary that the p-type impurity concentration in a superficial layer portion of the p$^+$-type contact layer 8 is equal to or higher than $1\times10^{19}$ cm$^{-3}$.

In a seventh step, as shown in FIG. 11A and FIG. 11B, the insulating film 10 is formed over the guard ring layer 9 and over the end portion of the anode electrode 3.

In this manner, a SBD having a pn junction mixed therein is completed.

The ion irradiation intensities and the acceleration voltages of the p-type surface layer 4 and the p-type buried layer 5 are changed in accordance with the design value of the leakage current.

Although a rectangular shape is illustrated as the shape of the cell, a hexagonal shape or a circular shape is also adoptable. In the array, the cells are arranged in a grid pattern. Instead, for example, the cells may be arranged in a zigzag pattern in which the positions of the adjacent cells are displaced from each other by half of the pitch.

This embodiment 1 illustrates a case where the width of the p$^+$-type contact layer 8 is larger than the width of the p-type surface layer 4 in a plan view. However, the width of the p$^+$-type contact layer 8 may be smaller than the width of the p-type surface layer 4 as long as a good contact resistance is provided.

In this embodiment 1, the p-type surface layer 4 and the p⁺-type contact layer 8 in the contact cell 7 are formed in different steps using different masks. However, the p-type surface layer 4 and the p⁺-type contact layer 8 may be formed integrally by using the same implantation mask.

Figure 16:
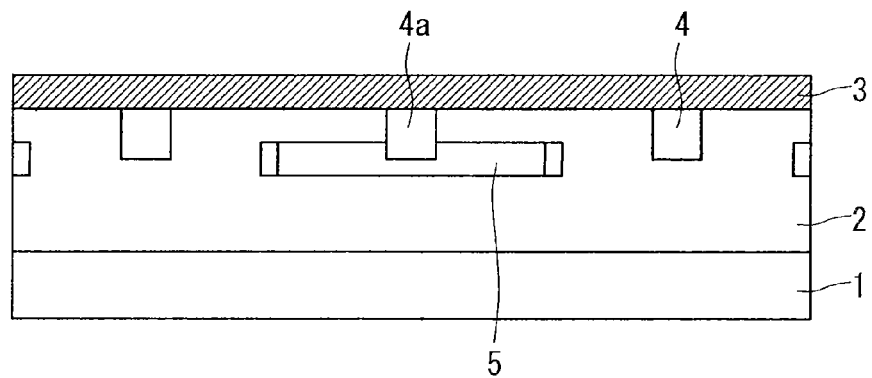
FIG. 16 is a cross-sectional view showing the semiconductor device during the manufacturing process according to the embodiment 1 of the present invention.

FIG. 16 is a cross-sectional view showing the A-A' portion of FIG. 1. This cross-sectional view shows a state where, under a different ion implantation condition, the anode electrode 3 and the p-type buried layer 5 are connected via the p-type surface layer 4.

Herein, a description will be given to a method for forming a p-type surface layer 4a having the p⁺-type contact layer 8 provided therein. Firstly, an opening region of a mask corresponding to the p-type surface layer 4a is formed. Then, ion implantation is performed while the acceleration voltage is varied in multiple energy levels from 40 keV to 700 keV. For implanted ions, aluminum is used as p-type impurities. Thus, an implanted layer having a box-shaped profile in which the depth from the surface is 0.7 μm and the concentration is $2 \times 10^{17}$ cm$^{-3}$ is formed.

Then, without changing the mask, ion implantation is performed with an acceleration voltage of 40 keV and 100 keV. At this stage, the irradiation intensity is set to be $3 \times 10^{15}$ cm$^{-2}$. Thus, an implanted layer having a box-shaped profile in which the depth from the surface is 0.2 μm and the concentration is $1 \times 10^{20}$ cm$^{-3}$ is formed.

As a result, a high-concentration implanted layer having a box-shaped profile in which the implantation concentration is about $1 \times 10^{20}$ cm$^{-3}$ is formed in a range from the surface to the 0.2 μm depth of the n⁻-type semiconductor layer 2, while an implanted layer having a box-shaped profile in which the implantation concentration is $2 \times 10^{17}$ cm$^{-3}$ is formed in a range exceeding the 0.2 μm depth and less than 0.7 μm depth. The p-type surface layer 4a can be obtained by these implanted layers.

The p-type surface layer 4a is in contact with the anode electrode 3 and the p-type buried layer 5 within the contact cell 7. In this example, the implantation concentration is high in the vicinity of the interface between the p-type surface layer 4a and the anode electrode 3. Therefore, the contact resistance between the p-type surface layer 4a and the anode electrode 3 can be reduced.

The p-type surface layer 4 within the normal cell is also formed under the same implantation conditions as for the formation of the p-type surface layer 4a within the contact cell 7. Therefore, the contact resistance between the p-type surface layer 4 and the anode electrode 3 in the normal cell can be reduced.

In this embodiment 1, it is not always necessary to simultaneously form p-type surface layers in the normal cell 6 and the contact cell 7. The p-type surface layers in the normal cell 6 and the contact cell 7 may be individually formed by using different masks under different ion implantation conditions.

Figure 17:
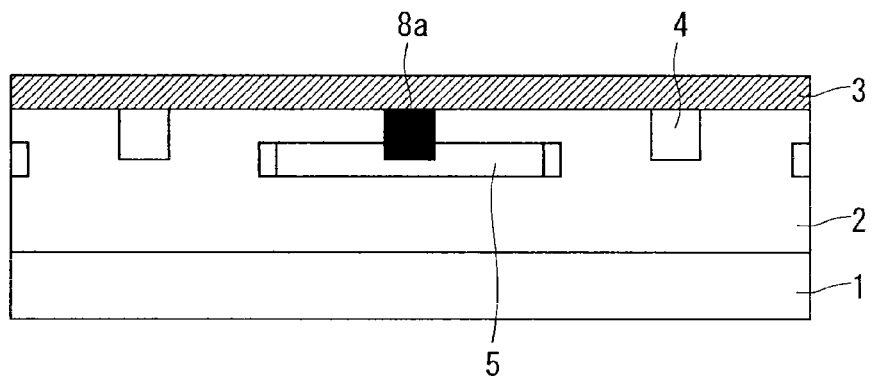
FIG. 17 is a cross-sectional view showing the semiconductor device during the manufacturing process according to the embodiment 1 of the present invention.

In such a case, the location of the high concentration implantation region of the p-type surface layer 4 within the contact cell is not limited to the vicinity of the surface. For example, as shown in FIG. 17, a high-concentration implanted layer may be formed so as to range from the surface to the p-type buried layer 5.

That is, the implantation region of the p-type surface layer can be formed by a p⁺-type contact layer 8a. Electrically connecting the anode electrode 3 and the p-type buried layer 5 by the p⁺-type contact layer 8a reduces the resistance as compared with connecting them via the p-type surface layer 4. Therefore, a further high-speed switching operation is achieved.

A method for preparing the p⁺-type contact layer 8a in the contact cell 7 may be as follows. Firstly, an opening region of a mask corresponding to the p⁺-type contact layer 8a is formed. Then, ion implantation is performed while the acceleration voltage is varied in multiple energy levels from 40 keV to 700 keV. For implanted ions, aluminum is used as p-type impurities. Thus, an implanted layer having a box-shaped profile in which the depth from the surface is 0.7 μm and the concentration is $1 \times 10^{20}$ cm$^{-3}$ is formed. This p⁺-type contact layer 8a is connected to the p-type buried layer 5 within the p-type buried layer 5.

In a case where an high-concentration implantation region having a concentration of $1 \times 10^{19}$ cm$^{-3}$ or higher is formed as the p⁺-type contact layer 8a in the n⁻-type semiconductor layer 2, there is a fear that an electric field may concentrate on the boundary between the p⁺-type contact layer 8a and the n⁻-type semiconductor layer 2, which may lower the breakdown voltage. However, in this embodiment, the p⁺-type contact layer 8a is connected to the p-type buried layer 5 within the p-type buried layer 5 having a lower concentration than the concentration in the p⁺-type contact layer 8a. This reduces the concentration of the electric field, and as a result no decrease in the breakdown voltage occurs.

Figure 18:
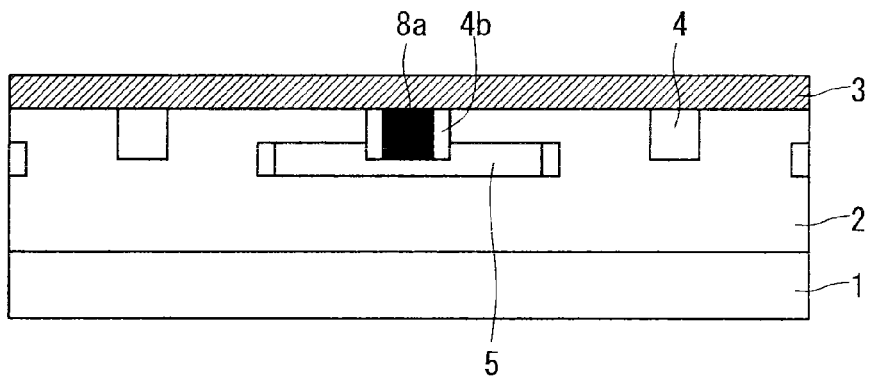
FIG. 18 is a cross-sectional view showing the semiconductor device during the manufacturing process according to the embodiment 1 of the present invention.

In order to further reduce the concentration of an electric field on a portion in the vicinity of the p⁺-type contact layer 8a, it is effective that, as shown in FIG. 18, a p-type surface layer 4b having a lower concentration than the concentration in the p⁺-type contact layer 8a is formed so as to surround a side surface of the p⁺-type contact layer 8a.

It may be also possible that the p-type surface layer 4 in the normal cell 6 is formed thinner than the p-type surface layer in the contact cell 7.

For example, a mask opening corresponding to the p-type surface layer 4 is formed only in the normal cell 6. Then, ion implantation is performed by using aluminum as p-type impurities with an irradiation intensity of $6 \times 10^{13}$ cm$^{-2}$ while the acceleration voltage is varied in multiple levels from 40 keV to 350 keV. Thereby, an implanted layer having a box-shaped profile in which the depth from the surface is 0.35 μm and the concentration is $4 \times 10^{17}$ cm$^{-3}$ is formed. Since the thickness of the p-type surface layer 4 in the normal cell 6 is reduced, the current path can be enlarged when the forward voltage is applied. Thus, the on-voltage can be lowered.

It may be also possible that the thickness of the p-type surface layer 4 is reduced to achieve a high concentration, within a range that ensures the breakdown voltage. For example, the p-type surface layer 4 in the normal cell 6 may be formed under the same ion implantation conditions as for the formation of the p⁺-type contact layer 8. In such a case, the p-type surface layer 4 and the anode electrode 3 form an ohmic junction. Therefore, when the forward voltage is applied under a state where the reverse voltage has been applied, the depletion layer having expanded from the p-type surface layer 4 disappears in a shortened time. This can achieve a further high-speed switching operation.

In this embodiment 1, the guard ring layer 9 and the p-type buried layer 5 are not in direct contact, but connected via the anode electrode 3. In this case, the strength of the electric field in the surface of the n⁻-type semiconductor layer 2 is high at the position corresponding to half of the distance between the p-type buried layer 5 and the guard ring layer 9. Therefore, it is desirable that the distance from the p-type buried layer 5 to the guard ring layer 9 is equal to or less than half of the cell pitch.

Figure 19:
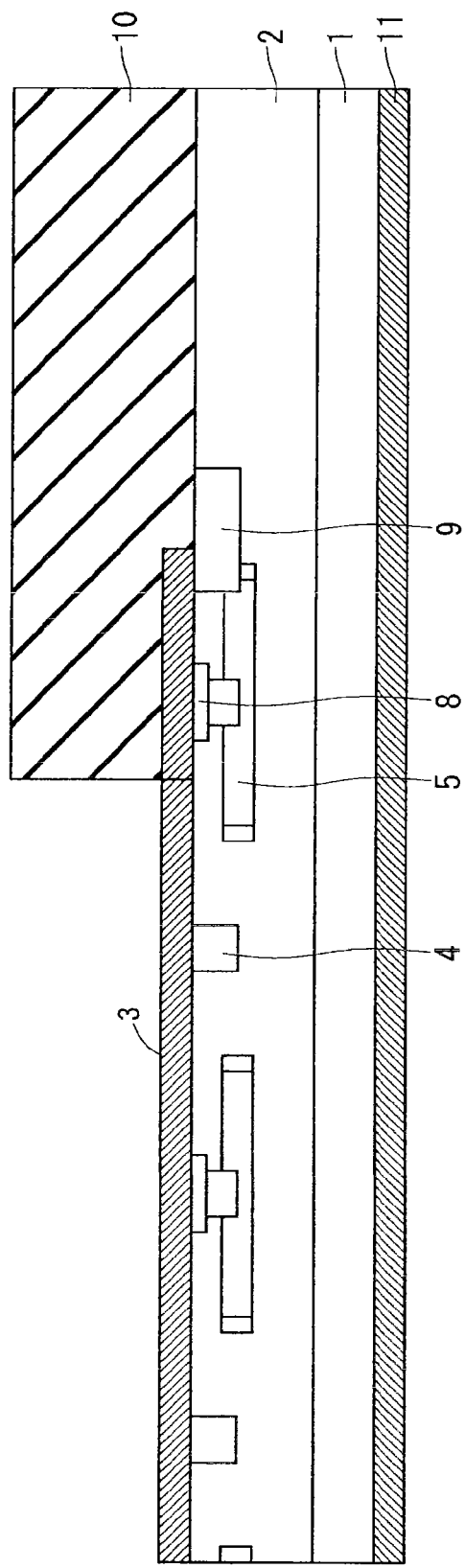
FIG. 19 is a cross-sectional view showing the semiconductor device during the manufacturing process according to the embodiment 1 of the present invention.

It may be also possible that the guard ring layer 9 is formed so as to partially overlap and connect with the p-type buried layer 5 in the normal cell 6 or in the contact cell 7. In this case, as shown in FIG. 19, a contact cell is arranged so as to overlap the guard ring layer 9. Thereby, the p-type buried layer 5 in the contact cell partially overlaps and connects with the guard ring layer 9. Although FIG. 19 shows a state where the p$^+$-type contact layer 8 is provided, this is also applicable to the structure shown in FIGS. 16 to 18.

In a case where the p-type buried layer 5 is not connected to the guard ring layer 9, positive charges existing in the guard ring layer 9 move to the anode electrode 3 via the Schottky interface when the reverse voltage is applied, to thereby form a depletion layer, which can maintain the breakdown voltage. In this case, a problem arises that the presence of the contact resistance in the Schottky interface hinders the positive charges from quickly moving to the anode electrode 3, resulting in limitation on a high-speed switching operation.

On the other hand, in a case where the guard ring layer 9 is electrically connected to the contact cell 7 via the p-type buried layer 5, the contact resistance to the anode electrode 3 is low and therefore positive charges existing in the guard ring layer 9 move to the anode electrode 3 via the p-type buried layer 5, the p-type surface layer 4, and the p$^+$-type contact layer 8 in the contact cell 7 when the reverse voltage is applied. Since the contact resistance between the p$^+$-type contact layer 8 and the anode electrode 3 is lower than the contact resistance of the Schottky interface, hole charges is able to quickly move. Thus, a high-speed switching operation is achieved.

Also in a case where the p-type buried layer 5 in the normal cell 6 is connected to the guard ring layer 9, a high-speed switching operation is similarly achieved because the p-type buried layer 5 in the normal cell 6 is connected to the p-type buried layer 5 in the contact cell 7.

In this embodiment 1, the implantation concentration in the p-type buried layer 5 is higher than that in the p-type surface layer 4 or in the guard ring layer 9. Needless to say, however, it may be adjusted in order to obtain a desired breakdown voltage. It may be acceptable that the implantation concentration in the p-type buried layer 5 is equal to or lower than the implantation concentration in the p-type surface layer 4 or in the guard ring layer 9.

Moreover, although the guard ring layer 9 and the p-type surface layer 4 are simultaneously formed, it may be also acceptable that the guard ring layer 9 and the p-type surface layer 4 are separately formed with different implantation concentrations and different implantation depths.

A-3. Effects

The embodiment 1 of the present invention provides a semiconductor device including a cell array in which the normal cells 6 are arranged and the contact cells 7 are interspersed around the arrangement of the normal cells 6. The semiconductor device includes: the n$^-$-type semiconductor layer 2 provided on the n$^+$-type semiconductor substrate 1; the p-type buried layer 5 buried within the n$^-$-type semiconductor layer 2; and the p-type surface layer 4 formed in the central portion of each of the normal cells 6 and contact cells 7. In the contact cell 7, the p-type buried layer 5 is in contact with the p-type surface layer 4. The semiconductor device further includes: the p$^+$-type contact layer 8 formed on the p-type surface layer 4 of the contact cell 7; and the anode electrode 3 provided on the n$^-$-type semiconductor layer 2. The anode electrode 3 forms a Schottky junction with the n$^-$-type semiconductor layer 2 and forms an ohmic junction with the p$^+$-type contact layer 8. The p-type buried layer 5 and the anode electrode 3 are connected to each other via the p-type surface layer 4 and the p$^+$-type contact layer 8. This can achieve reduction in the leakage current due to reduction in the strength of the electric field, reduction in the on-resistance due to enlargement of the current path, and a high-speed operation at a time of switching due to shortening of a time taken until the depletion layer disappears.

In the embodiment 1 of the present invention, in the semiconductor device, the p-type buried layer 5 is arranged throughout the range of the cell area of the contact cell 7. Accordingly, even when the p$^+$-type contact layer 8 formed on the p-type surface layer 4 which serves as the surface layer of the contact cell 7 which serves as the second cell occupies a larger width than the width occupied by the p-type surface layer 4 in a plan view, concentration of the electric field on a portion beyond the region corresponding to the p-type surface layer 4 is reduced due to the electric field shield effect of the p-type buried layer 5. As a result, no decrease in the breakdown voltage occurs.

Although the materials of the respective components, the conditions of implementation, and the like, are described in the embodiment of the present invention, the foregoing description is illustrative and not restrictive.

While the invention has been described in detail, the foregoing description is in all aspects illustrative and not restrictive. It is therefore understood that numerous modifications and variations can be devised without departing from the scope of the invention.

DESCRIPTION OF THE REFERENCE SIGNS 1, 41 n$^+$-type semiconductor substrate; 2, 42 n$^-$-type semiconductor layer; 3, 45 anode electrode; 4, 4a, 4b, 43a p-type surface layer; 5, 43b p-type buried layer; 6 normal cell; 7 contact cell; 8, 8a, 44 p$^+$-type contact layer; 9 guard ring layer; 10 insulating film; 11, 46 cathode electrode; 12-16 mask

The invention claimed is:
1. A semiconductor device including a cell array in which first cells are arranged and second cells are interspersed around the arrangement of the first cells, said semiconductor device comprising:
   a semiconductor layer having a first conductive type, said semiconductor layer being epitaxially formed on a semiconductor substrate having the first conductive type;
   a buried layer made of a semiconductor having a second conductive type, said buried layer being buried within said semiconductor layer, said buried layer being provided in a peripheral portion of said first cells and provided throughout an entire region of said second cells;
   at least one of a first surface layer made of a semiconductor having the second conductive type and a contact layer made of a semiconductor having the second conductive type, said first surface layer being formed in a central portion of said second cells on a surface of said semiconductor layer, said contact layer being formed in a central portion of said second cells on the surface of said semiconductor layer; and
   a second surface layer made of a semiconductor having the second conductive type, said second surface layer being formed in a central portion of said first cells on the surface of said semiconductor layer,
   wherein
   in said second cells, said buried layer is in contact with at least one of said first surface layer and said contact layer,
   said semiconductor device further comprises an anode electrode provided on said semiconductor layer, said anode electrode forming a Schottky junction with said semiconductor layer and forming an ohmic junction with at least one of said first surface layer and said contact layer, said buried layer and said anode electrode are connected to each other via at least one of said first surface layer and said contact layer.

2. The semiconductor device according to claim 1, wherein in a case where said first surface layer is provided and said contact layer is not provided, the concentration in a lower region of said first surface layer is lower than the concentration in an upper region of said first surface layer.

3. The semiconductor device according to claim 1, wherein in a case where both of said first surface layer and said contact layer are provided,
    said contact layer is formed on said first surface layer,
    in said second cells, said buried layer is in contact with said first surface layer, and
    said buried layer and said anode electrode are connected to each other via both of said first surface layer and said contact layer.

4. The semiconductor device according to claim 3, wherein the width occupied by said contact layer is larger than the width occupied by said first surface layer in a plan view.

5. The semiconductor device according to claim 1, wherein in a case where both of said first surface layer and said contact layer are provided,
    said first surface layer is formed so as to surround said contact layer in a plan view,
    in said second cells, said buried layer is in contact with both of said first surface layer and said contact layer, and
    said buried layer and said anode electrode are connected to each other via both of said first surface layer and said contact layer.

6. The semiconductor device according to claim 1, further comprising:
    a guard ring layer formed in an end portion of said anode electrode on the surface of said semiconductor layer;
    an insulating film formed so as to cover the end portion of said anode electrode and said guard ring layer; and
    a cathode electrode provided on a lower side of said semiconductor substrate, said cathode electrode forming an ohmic junction with the lower side of said semiconductor substrate.

7. The semiconductor device according to claim 6, wherein said buried layer is formed in contact with said guard ring layer.

* * * * *